United States Patent
Hishida et al.

(10) Patent No.: US 8,049,099 B2
(45) Date of Patent: Nov. 1, 2011

(54) SOLAR CELL AND SOLAR CELL MODULE INCLUDING THE SAME

(75) Inventors: Yuji Hishida, Osaka (JP); Shigeharu Taira, Amagasaki (JP)

(73) Assignee: Sanyo Electric Co., Ltd., Moriguchi-shi (JP)

(*) Notice: Subject to any disclaimer, the term of this patent is extended or adjusted under 35 U.S.C. 154(b) by 550 days.

(21) Appl. No.: 12/281,167

(22) PCT Filed: Feb. 27, 2007

(86) PCT No.: PCT/JP2007/053642
§ 371 (c)(1),
(2), (4) Date: Oct. 3, 2008

(87) PCT Pub. No.: WO2007/099955
PCT Pub. Date: Sep. 7, 2007

(65) Prior Publication Data
US 2009/0126788 A1  May 21, 2009

(30) Foreign Application Priority Data
Mar. 1, 2006 (JP) ................................ 2006-055532

(51) Int. Cl.
*H01L 31/00* (2006.01)

(52) U.S. Cl. ......... 136/256; 136/243; 136/244; 136/255

(58) Field of Classification Search ........... 136/243–265
See application file for complete search history.

(56) References Cited

U.S. PATENT DOCUMENTS

| | | | | |
|---|---|---|---|---|
| 6,384,317 B1 * | 5/2002 | Kerschaver et al. | ...... | 136/256 |
| 2004/0200520 A1 * | 10/2004 | Mulligan et al. | ...... | 136/256 |

FOREIGN PATENT DOCUMENTS

| | | |
|---|---|---|
| JP | 2001-267610 A | 9/2001 |
| JP | 2004-119687 A | 4/2004 |
| JP | 2004-221211 A | 8/2004 |
| JP | 3670834 B2 | 4/2005 |
| JP | 3679611 B2 | 5/2005 |
| JP | 2005-260157 A | 9/2005 |
| JP | 2005-260158 A | 9/2005 |

OTHER PUBLICATIONS

A. Schonecker et al., "An Industrial Multi-Crystalline EWT Solar Cell With Screen Printed Metallisation," the 14th European Photovoltaic Solar Energy Conference, Barcelona, 1997, p. 796-799.

* cited by examiner

*Primary Examiner* — Jennifer K. Michener
*Assistant Examiner* — Marla D McConnell
(74) *Attorney, Agent, or Firm* — Marvin A. Motsenbocker; Mots Law, PLLC

(57) ABSTRACT

Provided is a solar cell in which a linear n finger electrode and a linear p finger electrode are alternately arranged on a projection plane parallel to a main surface of a substrate, and which is arranged in a predetermined arrangement direction, including an n-side bus bar electrode connected to the n finger electrode and insulated from the p finger electrode and a p-side bus bar electrode connected to the p finger electrode and insulated from the n finger electrode. The n-side bus bar electrode and the p-side bus bar electrode are provided on a same main surface side of the substrate, intersect with the n finger electrode and the p finger electrode respectively on the projection plane, and have a slope angle relative to the predetermined arrangement direction.

8 Claims, 13 Drawing Sheets

FIG. 6
(a)
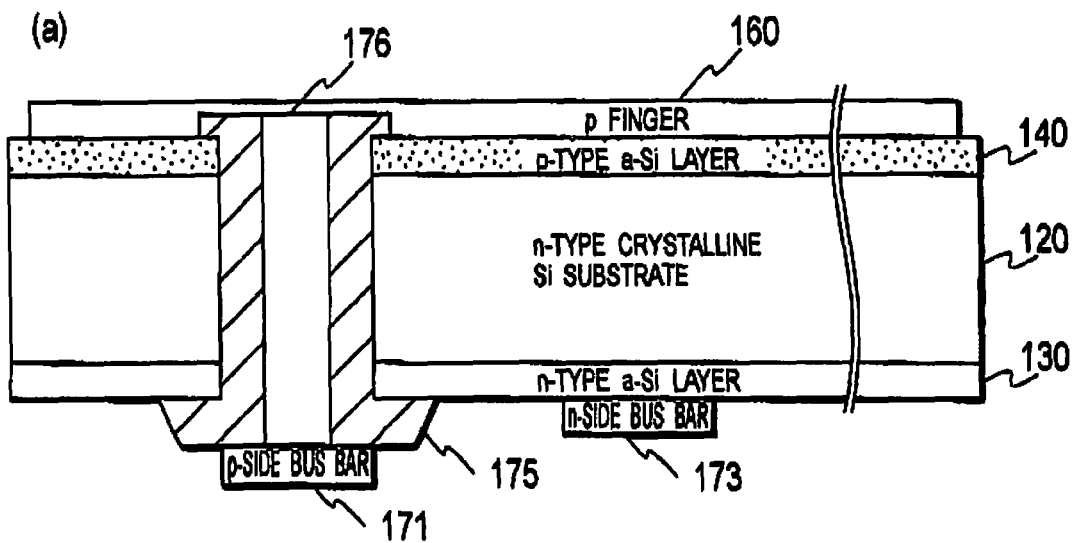
(b)
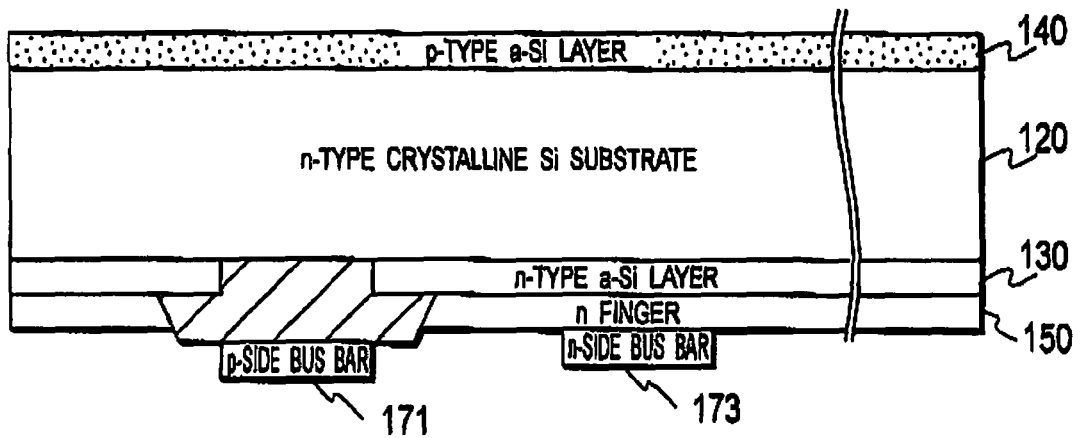

SOLAR CELL AND SOLAR CELL MODULE INCLUDING THE SAME

TECHNICAL FIELD

The present invention relates to a solar cell in which linear n finger electrodes and p finger electrodes are alternately arranged on a projection plane parallel to a main surface of a substrate, and a solar cell module including such solar cells.

BACKGROUND ART

In a conventional solar cell module including crystalline Si solar cells, a p-type region is provided on one of a front surface or a back surface of each of the solar cells, while an n-type region is provided on the other one of the front is surface or the back surface of each of the solar cells. In such solar cell modules, a front surface electrode provided on the front surface of one solar cell is connected to a back surface electrode provided on the back surface of a different solar cell adjacent to the one solar cell with wirings (e.g., Japanese Patent Publication No. 3670834 (see claim 1, [0017], FIG. 2, and the like).

In this solar cell module, the front surface electrode of the one solar cell is connected to the back surface electrode of the different solar cell with wirings. Thus, a processing for connecting the front surface and the back surface of the respective adjacent solar cells may cause a decrease in a positional accuracy of the wirings, a damage to the solar cells, or the like.

In contrast, as a technique for avoiding a processing for connecting front surfaces and back surfaces of each of the solar cells adjacent to each other, there has been a proposed technique in which solar cells are arranged by alternately inverting the polarities of the solar cells (e.g., Japanese Patent No. 3679611 (claim 1, [0007], and FIG. 2, and the like therein)).

More specifically, assume that a p-type region is provided on the front surface of one solar cell. In this case, an n-type region is provided on the front surface of a different solar cell adjacent to the one solar cell, and the front surface electrode provided on the front surface of the one solar cell is connected to the front surface electrode provided on the front surface of the different solar cell with the wirings. Thus, the processing for connecting the front surfaces and the back surfaces of each of the solar cells adjacent to each other can be avoided.

In addition, there has also been a proposed solar cell module in which both of a p-type region and an n-type region are provided on the back surface of a solar cell so that the solar cell does not need to locate the electrodes on the front surface thereof. This makes it possible to expand an area for receiving sunlight, and to improve a conversion efficiency.

In general, as an example of the soar cell module in which both of the p-type region and the n-type region are provided on the back surface of each of the solar cell, a solar cell module having a structure shown in FIG. 13 can be provided. FIG. 13 is a diagram showing the back surface of a solar cell module according to a conventional art.

As illustrated in FIG. 13, each of the solar cell has an n electrode 630, a p electrode 640, a metal piece 673 electrically connected to the n electrode 630, and an insulating region 675. In addition, the p electrode 640 of a solar cell a is connected to the n electrode 630 of a solar cell b with a plurality of tabs 671 (tab 671a to tab 671c) (e.g., A. Schoenecker, "A industrial multi-crystalline ewt solar cell with screen printed metallization," the 14th European Photovoltaic Solar Energy Conference, Barcelona, 1997, page. 796-799).

However, in order to insulate the n electrode and the p electrode from each other, there are restrictions in shapes and arrangement of the n electrodes and the p electrodes in the above-described conventional art. Similarly, the shapes and the arrangements of the tabs used for connecting the solar cells to each other are also restricted.

Thus, in the conventional art, it has been difficult to improve the conversion efficiency by devising the shapes and the arrangements of each of the electrode, each of the tab, and the like.

DISCLOSURE OF THE INVENTION

An aspect of the present invention is summarized as a solar cell in which a linear n finger electrode (n finger electrode 50) and a linear p finger electrode (p finger electrode 60) are alternately arranged on a projection plane parallel to a main surface of a substrate (n-type crystalline Si substrate 20), and which is arranged in accordance a predetermined arrangement direction (arrangement direction a), including: an n-side bus bar electrode (n bus bar 73) connected to the n finger electrode and insulated from the p finger electrode (p bus bar 71); and a p-side bus bar electrode connected to the p finger electrode and insulated from the n finger electrode, wherein the n-side bus bar electrode and the p-side bus bar electrode are provided on a same main surface side of the substrate, intersect with the n finger electrode and the p finger electrode respectively on the projection plane, and have a slope angle relative to the predetermined arrangement direction.

According to this aspect, an n-side bus bar electrode and a p-side bus bar electrode intersect with a linear n finger electrode and p finger electrode on the projection plane parallel to a main surface of a substrate. Hence, the degrees of freedom in the shapes, the arrangements and the like of the n-side bus bar electrode and the p-side bus bar electrode can be increased. In other words, the degree of freedom in design can be increased in improving conversion efficiency.

In addition, the n-side bus bar electrode and the p-side bus bar electrode have a slope angle relative to predetermined arrangement direction in which solar cells are located. Thus, the solar cells adjacent to each other can be connected in series without inverting the polarities of the solar cells adjacent to each other or without inverting the direction of the solar cells adjacent to each other.

In this aspect of the present invention, it is preferable that the p finger electrode is provided on a front side main surface of the substrate, the n finger electrode is provided on a back side main surface of the substrate, the n-side bus bar electrode and the p-side bus bar electrode are provided on the back-side main surface of the substrate, a through hole which penetrates the substrate from the front-side main surface to the back side main surface is provided, and the through hole establishes a connection between the p finger electrode provided on the front-side main surface, and the p-side bus bar electrode provided on the back side main surface.

In this aspect of the present invention, it is preferable that the n finger electrode is divided into the divided n finger electrodes, and is not located in a region where the p-side bus bar electrode is located, by sandwiching the p-side bus bar electrode between the divided n finger electrodes, and a divided n finger electrode located on the opposite side of the n-side bus bar electrode is connected to the n-side bus bar electrode.

In this aspect of the present invention, it is preferable that a first conductive member is located in the predetermined arrangement direction and connects each of the divided n finger electrode located on the opposite side of the n-side bus bar electrode; the aside bus bar electrode is located by leaving a predetermined space between the p-side bus bar electrode and a side of the substrate in the predetermined arrangement direction; and a second conductive member is located in the predetermined space and establishes a connection between the first conductive member and the n-side bus bar electrode.

In this aspect of the present invention, it is preferable that a p finger electrode passing through the predetermined space on the projection plane is connected to a through hole which corresponds to a p finger electrode not passing through the predetermined area on the projection plane.

An aspect of the present invention is summarized as a solar cell module In which a plurality of solar cells are arranged in predetermined arrangement direction, while the plurality of solar cells are formed by alternately arranging a linear n finger electrode and a linear p finger electrode on a projection plane parallel to a main surface of the substrate, wherein each of the plurality of solar cells includes: en n-side bus bar electrode connected to the n finger electrode and insulated from the p finger electrode and a p-side bus bar electrode connected to the p finger electrode and insulated from the n finger electrode and the n-side bus bar electrode and the p-side bus bar electrode are provided on a same main surface side of the substrate, and intersect with the n finger electrode and the p finger electrode respectively on the projection plane, and have a slope angle relative to the predetermined arrangement direction.

In this aspect of the present invention, it is preferable that a tub wire (copper tub wire 72) which connects the n-side bus bar electrode to the p-side bus bar electrode and which is located on the n-side bus bar electrode of one solar cell and on the p-side bus bar electrode of a different solar cell adjacent to the one solar cell, in which the one solar cell and the different solar cell are respectively included in the plurality of solar cells, wherein the n-side bus bar electrode of the one solar cell and the p-side bus bar electrode of the different solar cell are located on an approximately straight line.

BRIEF DESCRIPTION OF THE DRAWINGS

FIG. 6 is a diagram showing a cross section of a solar cell 100 according to a second embodiment of the present invention.

BEST MODES FOR CARRYING OUT THE INVENTION

Figure 1:
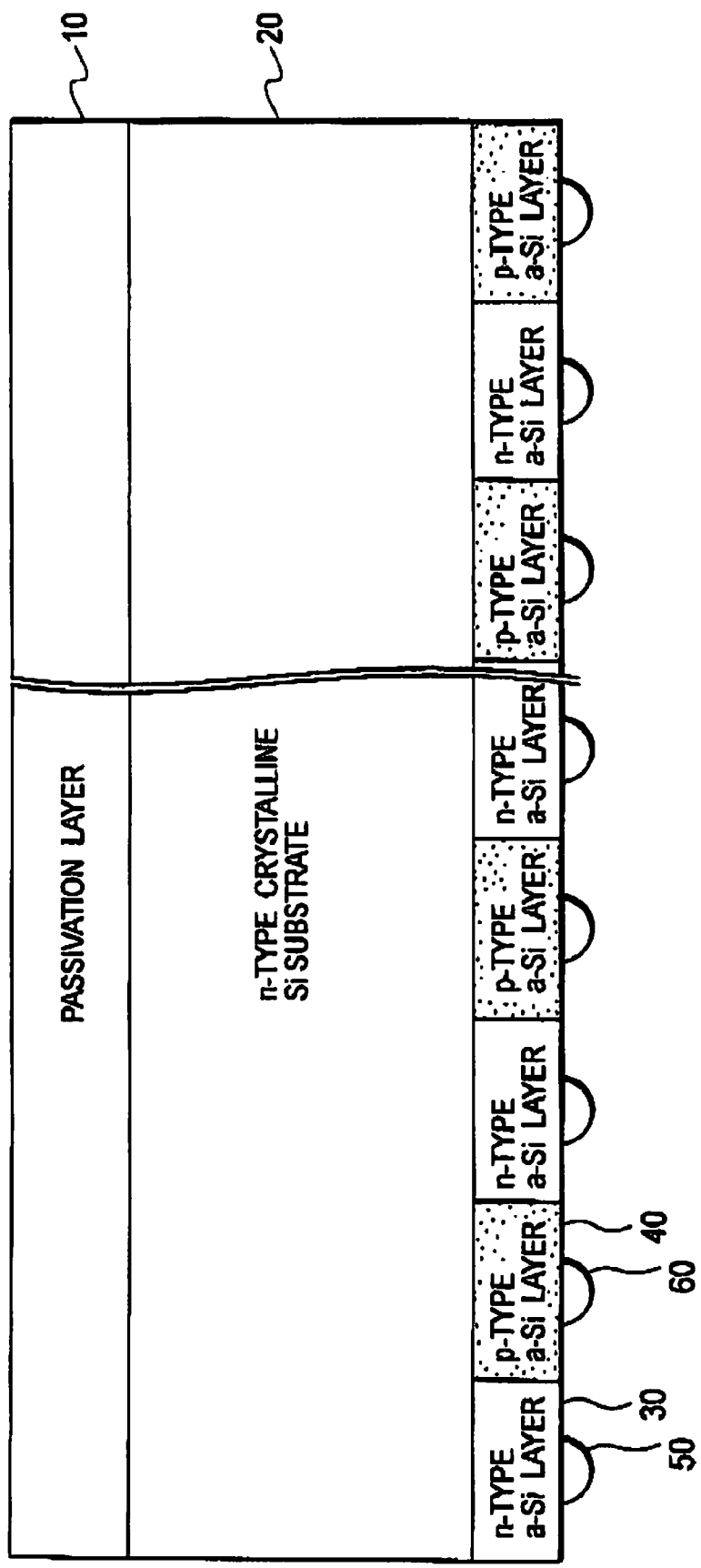
FIG. 1 is a diagram showing a cross section of a solar cell 100 according to a first embodiment of the present invention (No. 1).

Hereinafter, embodiments of the present invention will be described with reference to the drawings. Note that, in the description of the following drawings, the same or similar parts are denoted by the same or similar reference numerals. It should be noted that the drawings are schematic.

First Embodiment (Configuration of Solar Cell)

Hereinafter, the configuration of a solar cell according to a first embodiment of the present invention will be described with reference to the drawings. FIG. 1 is a diagram showing a cross section of a solar cell 100 according to the first embodiment of the present invention. Note that FIG. 1 is a sectional view in which the solar cell 100 is viewed from a direction A shown in FIG. 2 to be described later.

As shown in FIG. 1, the solar cell 100 includes a passivation layer 10, an n-type crystalline Si substrate 20, an n-type a-Si layer 30, a p-type a-Si layer 40, an n finger electrode 60 and a p finger electrode 60.

The passivation layer 10 is an amorphous Si layer and configured to have a function of protecting the solar cell 100. Incidentally, the n-type a-Si layer 30 and the p-type a-Si layer 40 may be configured of the crystalline Si same as the n-type crystalline Si substrate 20. Additionally, the amorphous Si layer may be a single layer of an amorphous Si layer, or may be a layer in which an amorphous Si layer and a transparent conductive film layer are laminated. Moreover, the passivation layer 10 may be composed of silicon oxide or silicon nitride.

The n-type crystalline Si substrate 20 is a substrate that absorbs solar light transmitting through the passivation layer 10. In the n-type crystalline Si substrate 20, an electron and a hole are generated by a solar light.

The n-type a-Si layer 30 is an n-type amorphous Si layer, and the electrons generated in the n-type crystalline Si substrate 20 gathers in the n-type a-Si layer 30.

The p-type a-Si layer 40 is a p-type amorphous Si layer, and the holes generated in the n-type crystalline Si substrate 20 gathers in the p-type a-Si layer 40.

The n finger electrode 50 is provided on the back surface of the solar cell 100 and is located on the n-type a-Si layer 30. In addition, the electrons gathered in the n-type a-Si layer 30 are taken out through the n finger electrode 50. Additionally, the n finger electrode 50 is connected to the n-type a-Si layer 30 and is insulated from the p-type a-Si layer 40. Incidentally, the n finger electrode 50 is formed by a printing method.

The p finger electrode 60 is provided on the back surface of the solar cell 100 and is located on the p-type a-Si layer 40. In addition, the holes gathered in the p-type a-Si layer 40 are taken out through the p finger electrode 60. Additionally, the p finger electrode 60 is connected to the p-type a-Si layer 40 and is insulated from the n-type a-Si layer 30. Incidentally, the p finger electrode 60 is formed by a printing method as similar to the n finger electrode 50.

Figure 2:
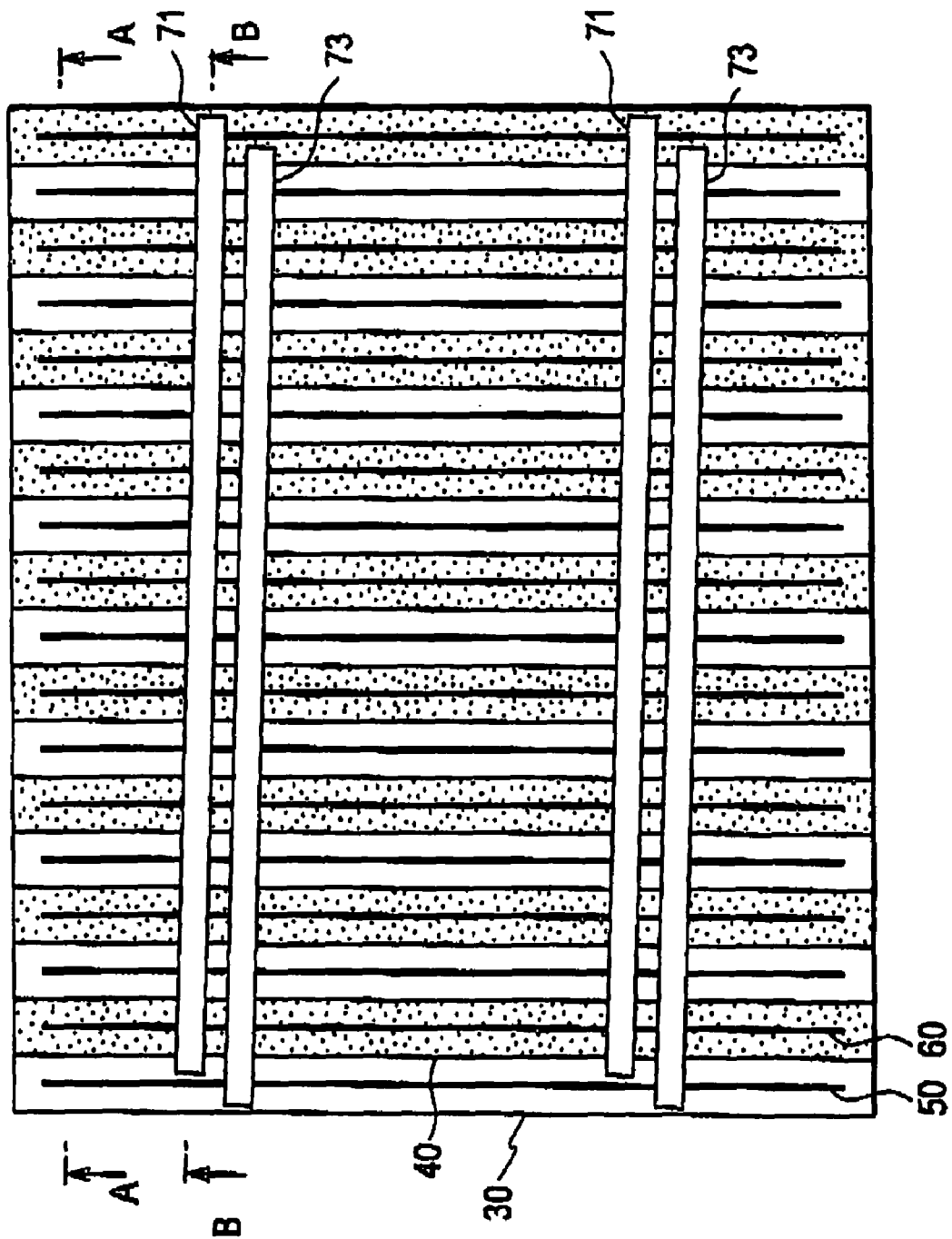
FIG. 2 is a diagram showing the back surface of the solar cell 100 according to the first embodiment of the present invention.

Next, the back surface of the solar cell 100 according to the first embodiment of the present invention will be described with reference to the drawings. FIG. 2 is a diagram showing the back surface of the solar cell 100 according to the first embodiment of the present invention.

As illustrated in FIG. 2, a p bus bar 71 and an n bus bar 73 are provided on the back surface of the solar cell 100 in addition to the n finger electrode 50 and the p finger electrode 60 described above.

The n finger electrode 50 described above is located along the n-type a-Si layer 30 and has a line shape. Similarly, the p finger electrode 60 described above is located along the p-type a-Si layer 40 and has a line shape.

In addition, the n finger electrode 50 and the p finger electrode 60 are is alternately arranged in an arrangement direction a. In other words, the n finger electrode 50 and the p finger electrode 60 are alternately arranged on a projection plane parallel to a main surface of the n-type crystalline Si substrate 20. Incidentally, the arrangement direction a indicates a direction in which each of the solar cells 100 is arranged in a solar cell module.

The p bus bar 71 is connected to the p finger electrode 60 and is insulated from the n finger electrode 50. In addition, the p bus bar 71 is configured to have a function of taking out holes through the p finger electrode 60. Additionally, the p bus bar 71 intersects with the n finger electrode 50 and the p finger electrode 60 respectively on the projection plane parallel to the main surface of the n-type crystalline Si substrate 20. Moreover, the p bus bar 71 is not parallel to the arrangement direction a and has a predetermined slope angle ($\theta_p$) relative to the arrangement direction a. Incidentally, the p bus bar 71 is formed by a printing method.

The n bus bar 73 is connected to the n finger electrode 50 and is insulated from the p finger electrode 60. In addition, the n bus bar 73 is configured to have a function of taking out electrons through the n finger electrode 50. Additionally, the n bus bar 73 intersects with the n finger electrode 50 and the p finger electrode 60 respectively on the projection plane parallel to the main surface of the n-type crystalline Si substrate 20. Moreover, the n bus bar 73 is not parallel to the arrangement direction a and has a predetermined slope angle ($\theta_n$) relative to the arrangement direction a. Incidentally, the n bus bar 73 is formed by a printing method as similar to the P bus bar 71.

Figure 3:
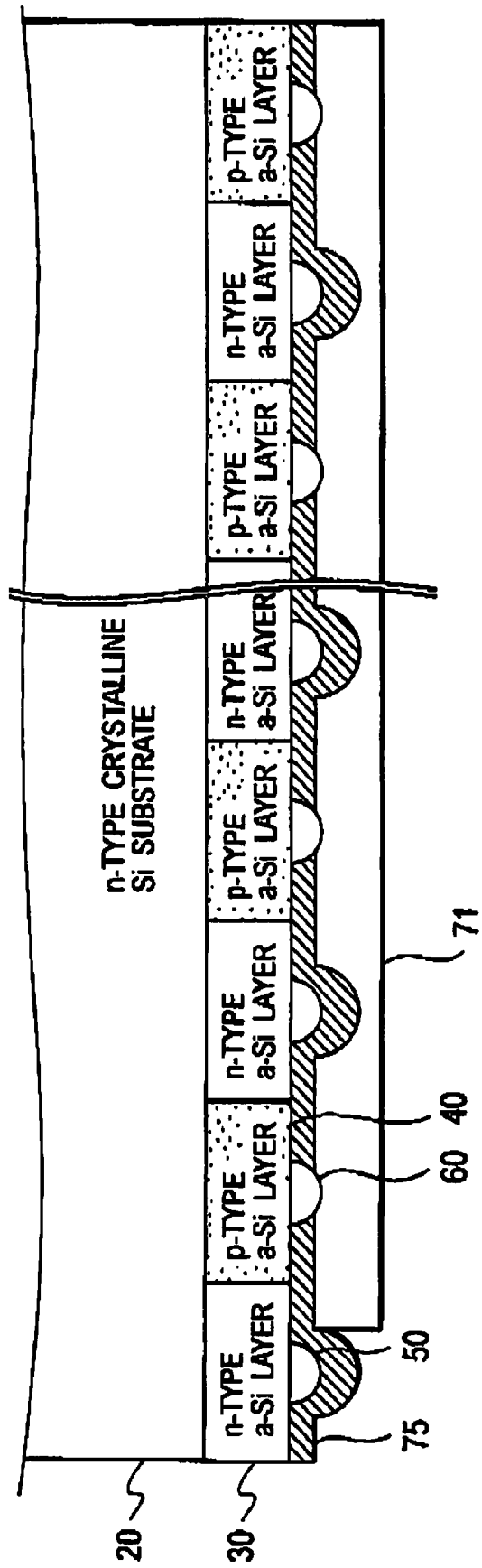
FIG. 3 is a diagram showing a cross section of the solar cell 100 according to the first embodiment of the present invention (No. 2).

Next a cross section of the solar cell 100 according to the first embodiment of the present invention will be described with reference to the drawings. FIG. 3 is a diagram showing a cross section of the solar cell 100 according to the first embodiment of the present invention. Note that, FIG. 3 is a sectional view in which the solar cell 100 is viewed from a direction B shown in FIG. 2 described above.

As shown in FIG. 3, the p bus bar 71 is insulated from the n finger electrode 50 by an insulating layer 75. Here, the insulating layer 75 is formed, for instance, in the following manner. Specifically, a resist is applied onto the p finger electrode 60 and then an insulating film (for instance, polyimide) is formed along a portion in which the p bus bar 71 is located. Subsequently, the insulating layer 75 is formed by removing the insulating film in the portion on which the resist is applied by a lift-off processing.

Note that, although not shown in FIG. 3, the n bus bar 73 is also insulated from the p finger electrode 60 by the same method as that in the p bus bar 71.

(Configuration of Solar Cell Module)

Figure 4:
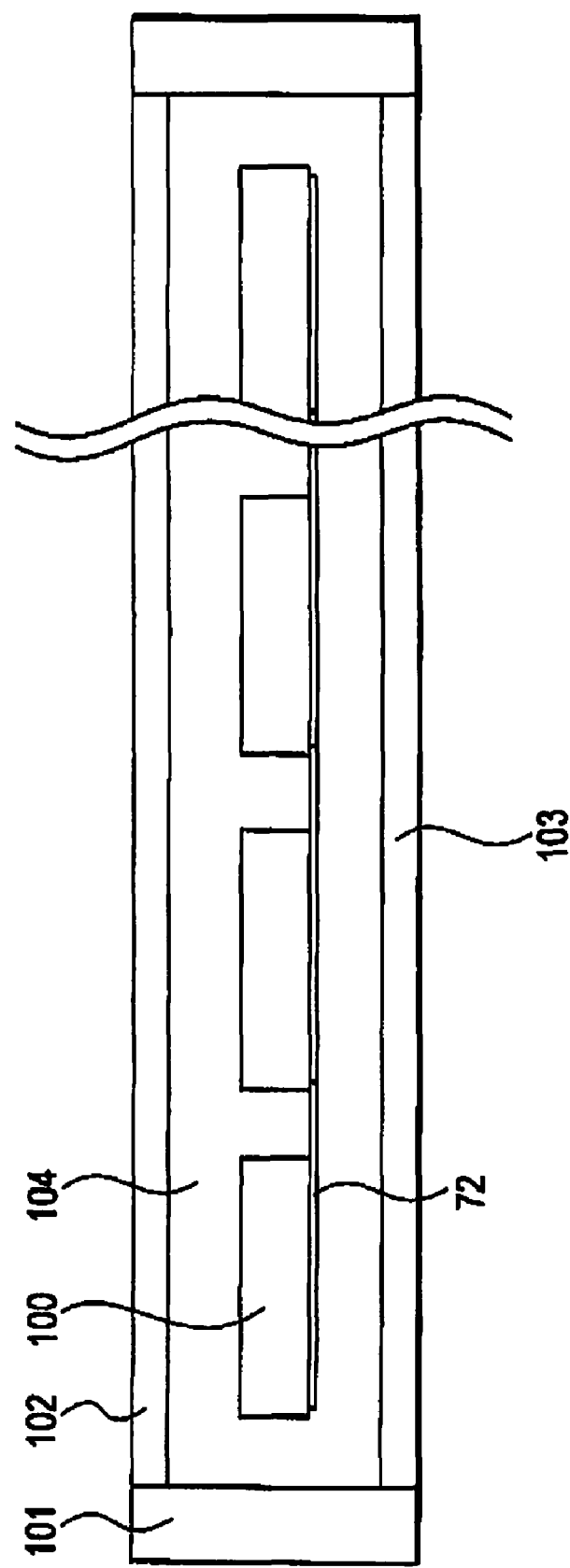
FIG. 4 is a diagram showing a solar cell module 200 according to the first embodiment of the present invention.

Hereinafter, the configuration of a solar cell module according to the first embodiment of the present invention will be described with reference to the drawings. FIG. 4 is a diagram showing the configuration of a solar cell module 200 according to the first embodiment of the present invention.

As shown in FIG. 4, the solar cell module 200 has a plurality of solar cells 100, a frame 101, a surface member 102, a back cover film 103 and a filling member 104. In addition, the solar cell module 200 has a copper tub wire 72 configured to connect in series the solar cells 100 adjacent to each other.

The frame 101 is an outer frame composed of aluminum or the like. Incidentally, the frame 101 may not be located as needed. The surface member 102 is composed of a glass or the like and protects the solar cell module 200 from the front surface side. The back cover film 103 is a weather-resistant film and protects the solar cell module 200 from the back surface. The filling member 104 is composed of EVA (ethylene-vinyl acetate) or the like and seals each of the solar cells 100 between the surface member 102 and the back cover film 103.

Figure 5:
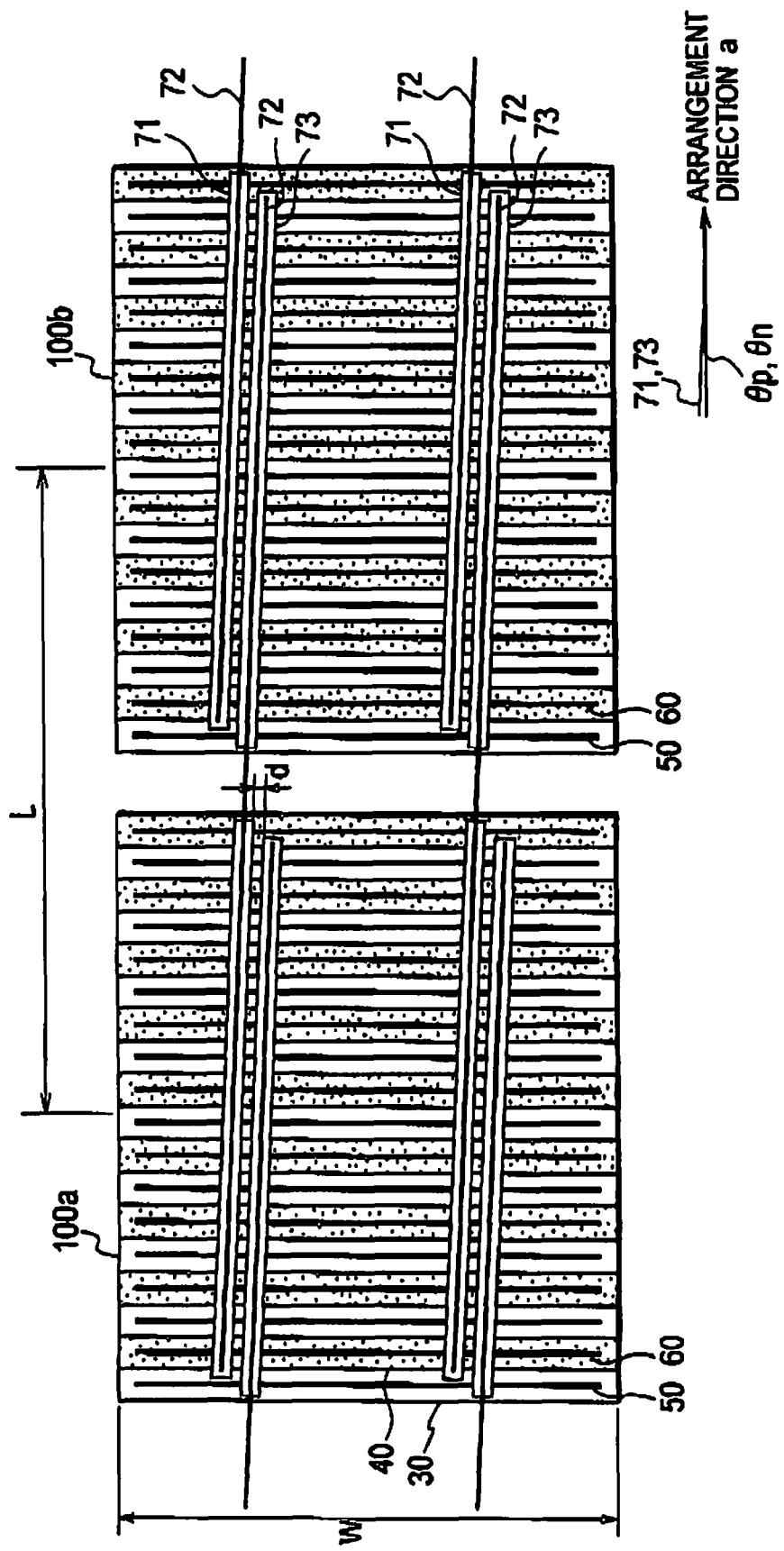
FIG. 5 is a diagram showing the back surface of the solar cell module 200 according to the first embodiment of the present invention.

FIG. 5 is a diagram showing the back surface of the solar cell module 200 according to the first embodiment of the present invention. Incidentally, in FIG. 5, a solar cell 100a and a solar cell 100b are included in the solar cells 100 that are adjacent to each other and connected in series.

As shown in FIG. 5, the solar cell module 200 has the plurality of solar cells 100 and a copper tub wire 72.

The copper tub wire 72 is located on the p bus bar 71 of the solar cell 100a and on the n bus bar 73 of the solar cell 100b adjacent to the solar cell 100a, and connects the p bus bar 71 and the n bus bar 73. In this manner, the copper tub wire 72 connects the solar cell 100a and the solar cell 100b in series. This makes it possible to take out photovoltaic current to outside.

In addition, the p bus bar 71 of the solar cell 100a and the n bus bar 73 of the solar cell 100b are located on an approximately straight line. Hence, the copper tub wire 72 has a linear shape along the p bus bar 71 of the solar cell 100a and the n bus bar 73 of the solar cell 100b.

Additionally, the p bus bar 71 and the n bus bar 73 are not parallel to the arrangement direction a, but have the predetermined slope angle ($\theta_p$ and $\theta_n$) relative to the arrangement direction a, as described above. Incidentally, in the first embodiment, $\theta_p$ and $\theta_n$ indicate the same angle.

Furthermore, when the distance between the center of the solar cell 100a and the center of the solar electronic cell b is set to be L, and a gap width between the p bus bar 71 and the n bus bar 73 is set to be d, $\theta_p$ and $\theta_n$ preferably satisfy L×tan $\theta_p$>d and L×tan $\theta_n$>d, respectively.

In addition, when the length of the solar cell 100 in a direction orthogonal to the arrangement direction a is set to be W, $\theta_p$ and $\theta_n$ preferably satisfy L×tan $\theta_p$>½W−d and L×tan $\theta_n$>½W−d, respectively.

(Operation and Effect)

According to the solar cell 100 and the solar cell module 200 in the first embodiment of the present invention, the p bus bar 71 is insulated from the n finger electrode 50, and the n bus bar 73 is insulated from the p finger electrode 60. In addition, the p bus bar 71 and the n bus bar 73 intersect with the n finger electrode 60 and the p finger electrode 60 respectively on the projection plane parallel to the main surface of the n-type crystalline Si substrate 20.

Thus, the degrees of freedom in the shapes and the arrangements of the p bus bar 71 and the n bus bar 73 can be increased. In other words, the degree of freedom in design can be increased in improving conversion efficiency.

Moreover, according to the solar cell 100 and the solar cell module 200 in the first embodiment of the present invention, the p bus bar 71 and the n bus bar 73 are not parallel to the arrangement direction a, but have the predetermined slope angle ($\theta_p$, $\theta_n$) relative to the arrangement direction a.

Accordingly, the solar cells 100 that are adjacent to each other can be connected in series without inverting the polarity of the solar cell 100 or without inverting the direction of the solar cell 100 as compared with the case where the p bus bar 71 and the n bus bar 73 are located parallel to the arrangement direction a. In other words, the productivity of the solar cell module 200 is improved since no attention needs to be paid to the arrangement relationship of the solar cells 100.

In addition, according to the solar cell 100 and the solar cell module 200 according to the first embodiment of the present invention, the p bus bar 71 of the solar cell 100a and the n bus bar 73 of the solar cell 100b adjacent to the solar cell 100a are located on the approximately straight line.

Accordingly, since the copper tub wire 72 located on the p bus bar 71 of the solar cell 100a and the n bus bar 73 of the solar cell 100b has no need to be bent and deformed, the arrangement of the copper tub wire 72 becomes easy, thereby suppressing a decrease in the durability of the copper tub wire 72.

Second Embodiment

Hereinafter, a second embodiment of the present invention will be described with reference to the drawings. In addition, the difference between the first embodiment described above and the second embodiment will be mainly described.

More specifically, although the n finger electrode and the p finger electrode are provided on the back surface of the solar cell 100 in the first embodiment described above, the p finger electrode is provided on the front surface of the solar cell 100, and the p bus bar is provided on the back surface of the solar cell 100, in the second embodiment.

(Configuration of Solar Cell)

Hereinafter, the configuration of a solar cell according to the second embodiment of the present invention will be described with reference to the drawings. FIG. 6 is a diagram showing a cross section of a solar cell 100 according to the second embodiment of the present invention. Note that, FIG. 6(a) is a sectional view in which the solar cell 100 is viewed from a direction C shown in FIG. 7 to be described later, while FIG. 6(b) is a sectional view in which the solar cell 100 is viewed from a direction D shown in FIG. 7 to be described later.

As shown in FIG. 6(a), the solar cell 100 includes an n-type Si substrate 120, an n-type a-Si layer 130, a p-type a-Si layer 140, a p finger electrode 160, a p bus bar 171, an n bus bar 173, an insulating member 175 and a through hole 176.

The n-type Si substrate 120, the n-type a-Si layer 130, the p-type a-Si layer 140, the p finger electrode 160, the p bus bar 171 and the n bus bar 173 have configurations similar to the n-type crystalline Si substrate 20, the n-type a-Si layer 30, the p-type a-Si layer 40, the p finger electrode 60, the p bus bar 71 and the n bus bar 73 described above. However, in the second embodiment, the p-type a-Si layer 140 and the p finger electrode 160 are located on the front surface side of the solar cell 100.

The insulating member 175 is configured so as to cover the outer circumference of the through hole 176 located by penetrating the p-type a-Si layer 140, the n-type Si substrate 120 and the type a-Si layer 130. The insulating member 175 insulates the p-type a-Si layer 140 and the p finger electrode 160, from the n-type Si substrate 120 and the n-type a-Si layer 130.

A conductive paste is applied to the inner circumference of the through hole 176 and the through hole 176 connects the p bus bar 171 and the p finger electrode 160. Incidentally, the through hole 176 is formed by wet etching that uses fluoronitric acid, by dry etching that uses $Cl_2$, $Cl_4$, or $BCl_3$, by ion milling that uses $Ar^+$ or the like, by laser ablation that uses a YAG laser or the like.

In addition, as shown in FIG. 6(b), the solar cell 100 has an n finger electrode 150 on the back surface of the solar cell 100 in addition to the configuration shown in FIG. 6(a). Incidentally, the n finger electrode 150 has a configuration similar to the above-described finger 50. Here, the above-described insulating member 175 insulates the p-type a-Si layer 140, the p finger electrode 160, and the p bus bar 171 from the n finger electrode 150.

(Configuration of Solar Cell Module)

Figure 7:
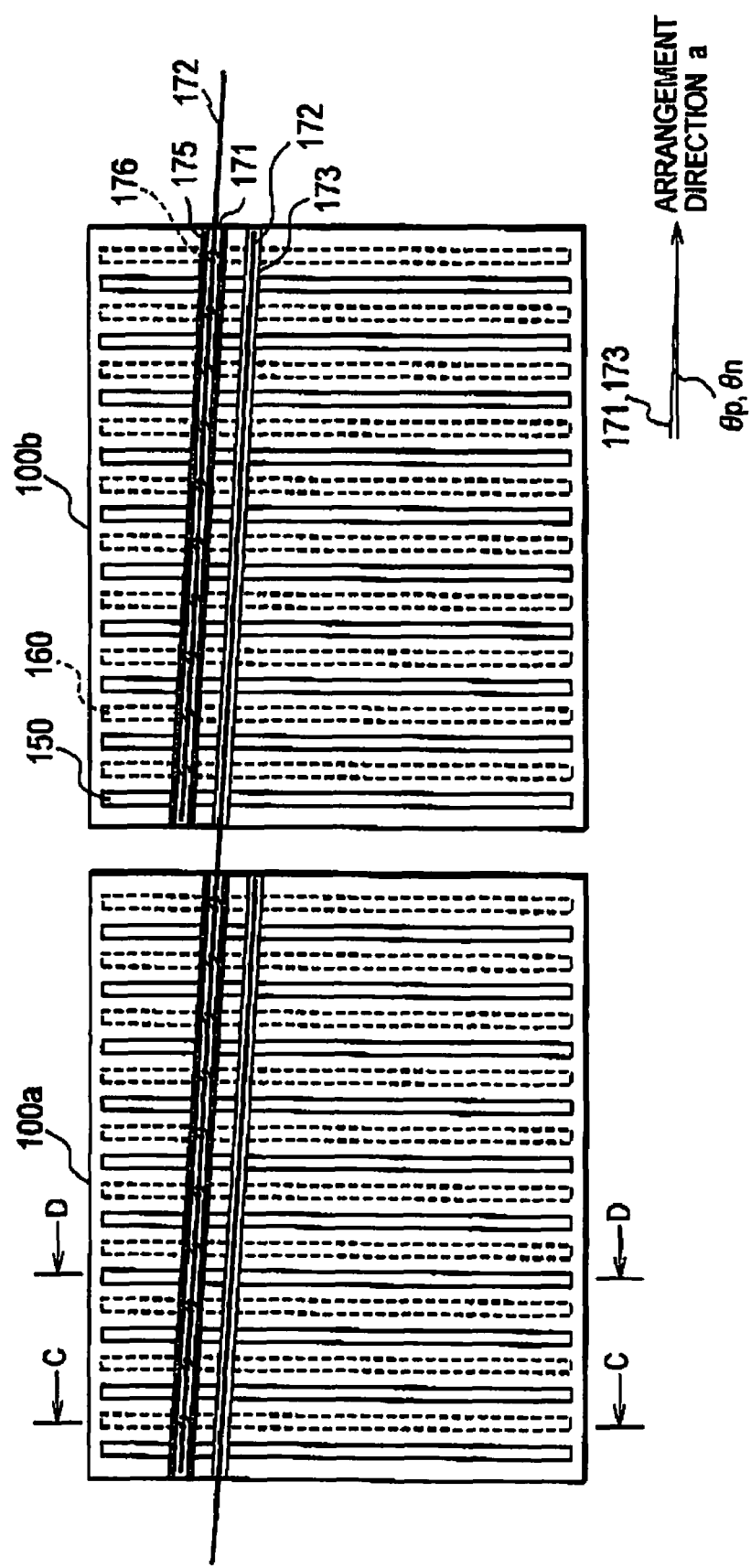
FIG. 7 is a diagram showing the back surface of a solar cell module 200 according to the second embodiment of the present invention.

Next, the configuration of a solar cell module according to the second embodiment of the present invention will be described with reference to the drawings. FIG. 7 is a diagram showing the configuration of a solar cell module 200 according to the second embodiment of the present invention. Incidentally, FIG. 7 is a diagram in which the solar cell module 200 is viewed from the back surface of each of the solar cells 100.

As shown in FIG. 7, the solar cell module 200 has the plurality of solar cells 100 and a copper tub wire 172. Note that, the copper tub wire 172 connects in series the solar cells 100 (the solar cell 100a and the solar cell 100b) that are adjacent to each other as similar to the above-described copper tub wire 72.

The p bus bar 171 has a predetermined slope angle ($\theta_p$) relative to the arrangement direction a, that is a direction in which the solar cells 100 are arranged. Similarly, the n bus bar 173 has a predetermined slope ($\theta_n$) relative to the arrangement direction a, that is a direction in which the solar cells 100 are arranged. In addition, the above-described through hole 176 is formed along the p bus bar 171.

Here, the n finger electrode 150 and the p finger electrode 160 are alternately arranged on a projection plane parallel to the main surface of the n-type Si substrate 120, and have a line shape.

Additionally, the p bus bar 171 is connected to the p finger electrode 160 through the through hole 176 and is insulated from the n finger electrode 150 by the insulating member 175. On the other hand, the n bus bar 173 is connected to the n finger electrode 150 and is insulated from the p finger electrode 160 provided on the front surface side of the solar cell 100.

Moreover, the p bus bar 171 and the n bus bar 173 intersect with the n finger electrode 150 and the p finger electrode 160 on the projection plane parallel to the main surface of the n-type Si substrate 120.

Furthermore, the p bus bar 171 of the solar cell 100a and the n bus bar 173 of the solar cell 100b are located on an approximately straight line.

(Operation and Effect)

According to the solar cell 100 and the solar cell module 200 in the second embodiment of the present invention, the p bus bar 171 and the n bus bar 173 intersect with the n finger electrode 160 and the p finger electrode 160 respectively on the projection plane parallel to the main surface of the n-type Si substrate 120. In addition, the p finger electrode 160 is located on the front surface side of the n-type Si substrate 120. Hence, the degrees of freedom in the shapes and the arrangements of the n finger electrode 150, the p finger electrode 160, the p bus bar 171 and the n bus bar 173 can be increased.

More specifically, the areas of the n-type a-Si layer 130 and the p-type a-Si layer 140 are enlarged as in the second embodiment of the present invention. Accordingly, the n finger electrode 150 can efficiently take out electrons gathered in the n-type a-Si layer 130, and the p finger electrode 160 can efficiently take out holes gathered in the p-type a-Si layer 140.

Additionally, according to the solar cell 100 and the solar cell module 200 in the second embodiment of the present invention, the p bus bar 171 and the n bus bar 173 are not parallel to the arrangement direction a, but have the predetermined slope angle ($\theta_p$, $\theta_n$) relative to the arrangement direction a.

Thus, the solar cells 100 that are adjacent to each other can be connected in series without inverting the polarity of the solar cell 100 or without inverting the direction of the solar cell 100 as compared with the case where the p bus bar 171 and the n bus bar 173 are located parallel to the arrangement direction a. In other words, the productivity of the solar cell module 200 is improved since no attention needs to be paid to the arrangement relationship of the solar cells 100.

In addition, according to the solar cell 100 and the solar cell module 200 in the second embodiment of the present invention, the p bus bar 171 of the solar cell 100a and the n bus bar 173 of the solar cell 100b adjacent to the solar cell 100a are located on the approximately straight line.

Accordingly, since the copper tub wire 172 located on the p bus bar 171 of the solar cell 100a and the n bus bar 173 of the solar cell 100b has no need to be bent and deformed, the arrangement of the copper tub wire 172 becomes easy, thereby suppressing a decrease in the durability of the copper tub wire 172.

Third Embodiment

Hereinafter, a third embodiment of the present invention will be described with reference to the drawings. Note that, the difference between the first embodiment described above and the third embodiment will be mainly described below.

More specifically, although the p-type a-Si layer is provided on the back surface side of the solar cell 100 in the first embodiment as described above, the p-type a-Si layer is provided on the front surface side of the solar cell 100 and the p finger electrode and the p bus bar are provided on the back surface side of the solar cell 100, in the third embodiment.
(Configuration of Solar Cell)

Figure 8:
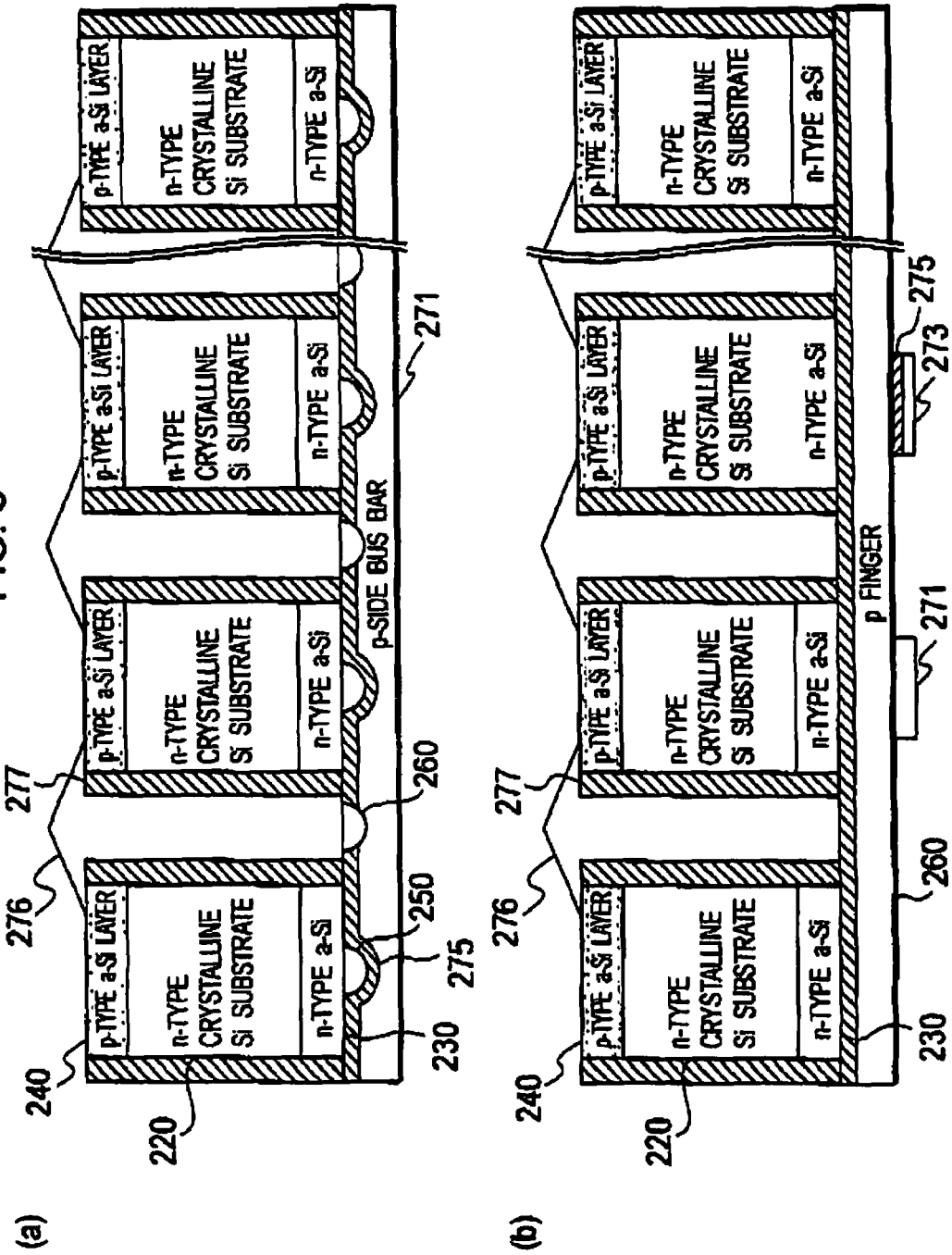
FIG. 8 is a diagram showing a cross section of a solar cell 100 according to a third embodiment of the present invention.

Hereinafter, the configuration of a solar cell according to the third embodiment of the present invention will be described with reference to the drawings. FIG. 8 is a diagram showing a cross section of a solar cell 100 according to the third embodiment of the present invention. Note that, FIG. 8(a) is a sectional view in which the solar cell 100 is viewed from a direction E shown in FIG. 9 to be described later, while FIG. 8(b) is a sectional view in which the solar cell 100 is viewed from a direction F shown in FIG. 9 to be described later.

As shown in FIG. 8(a), the solar cell 100 has an n-type Si substrate 220, an n-type a-Si layer 230, a p-type a-Si layer 240, an n finger electrode 250, a p finger electrode 260, a p bus bar 271, an insulating layer 275, a conductive member 276 and an insulating member 277.

The n-type Si substrate 220, the n-type a-Si layer 230, the p-type a-Si layer 240, the n finger electrode 250, the p finger electrode 260, the p bus bar 271 and the insulating layer 275 have configurations similar to the n-type crystalline Si substrate 20, the n-type a-Si layer 30, the p-type a-Si layer 40, the n finger electrode 50, the p finger electrode 60, the p bus bar 71 and the insulating layer 75 described above. Note that, however, the p-type a-Si layer 240 is provided on the front surface side of the solar cell 100.

The conductive member 276 is formed of conductive members, and connects the Si-type a-Si layer 240 and the p finger electrode 60. On the other hand, the insulating member 277 is configured to cover the side circumference of the conductive member 276, and insulates the n-type Si substrate 220 and the n-type a-Si layer 230, from the p finger electrode 60 and the conducive member 270.

In addition, the conductive member 276 is filled in a through hole after the through hole is formed by wet etching that uses fluoro-nitric acid, by dry etching that uses $Cl_2$, $Cl_4$, or $BCl_3$, by ion milling that uses $Ar^+$ or the like, and by laser processing that uses a YAG laser, or the like.

As shown in FIG. 8(b), the solar cell 100 has an n bus bar 273 in addition to the configuration shown in FIG. 8(a). Note that, the n bus bar 273 has a configuration similar to the n bus bar 73 as described above, and is insulated from the p finger electrode 260 by the insulating layer 275. Incidentally, a method of insulating the n bus bar 273 and the p finger electrode 260 is similar to the method of insulating the p bus bar 271 and the n finger electrode 250 shown in FIG. 8(a).

Additionally, the above-described insulating member 277 is located at a boundary area between the n-type a-Si layer 230 and the p finger electrode 60, and insulates the n-type a-Si layer 230 from the p finger electrode 60.
(Configuration of Solar Cell Module)

Figure 9:
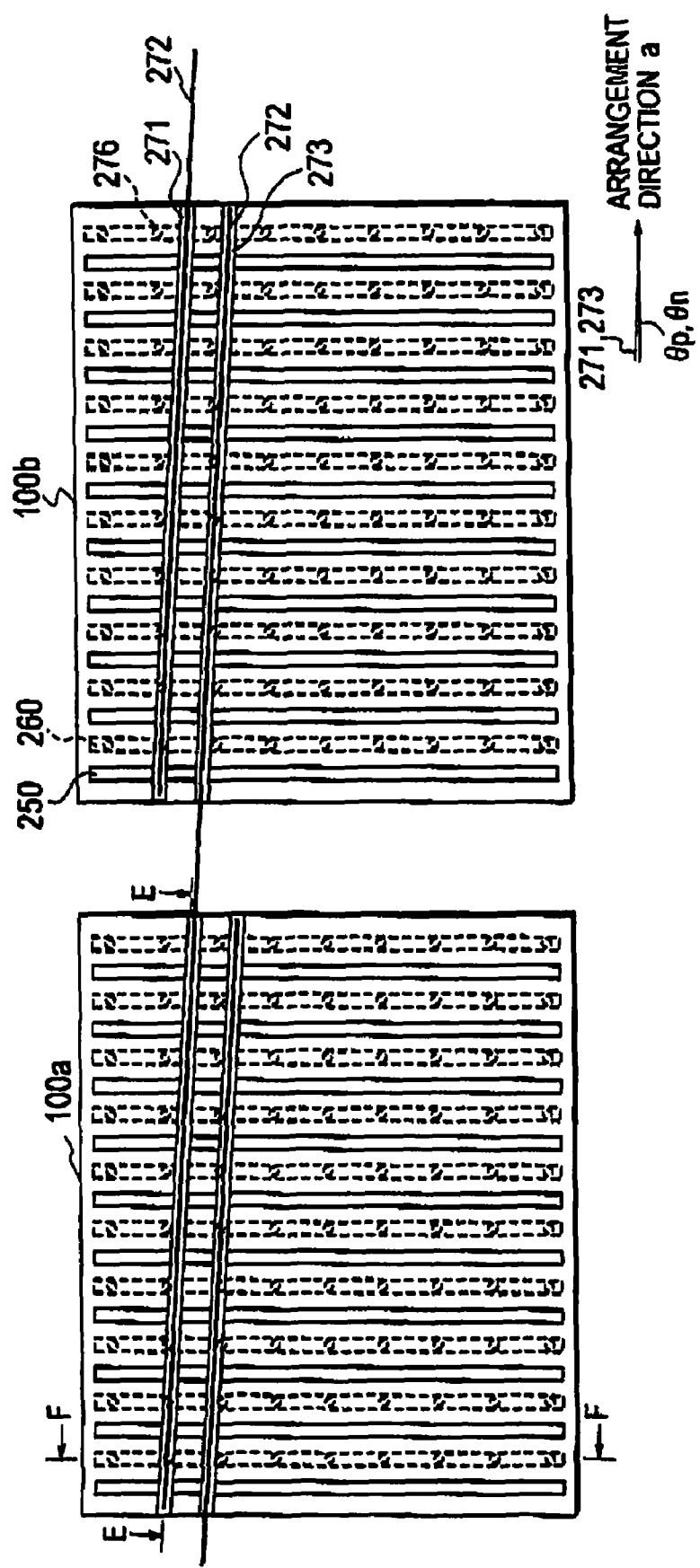
FIG. 9 is a diagram showing a solar cell module 200 according to the third embodiment of the present invention.

Next, the configuration of a solar cell module according to the third embodiment of the present invention will be described with reference to the drawings. FIG. 9 is a diagram showing the configuration of a solar cell module 200 according to the third embodiment of the present invention. Note that, FIG. 9 is a diagram in which the solar cell module 200 is viewed from the back surface side of each of the solar cells 100.

As shown in FIG. 9, the solar cell module 200 has the plurality of solar cells 100 and a copper tub wire 272. In addition, the copper tub wire 272 connects in series the solar cells 100 (the solar cell 100a and the solar cell 100b) that are adjacent to each other as similar to the above-described copper tub wire 72.

The p bus bar 271 has a predetermined slope angle ($\theta_p$) relative to an arrangement direction a, that is a direction in which the solar cells 100 are arranged. Similarly, the n bus bar 273 has a predetermined slope angle ($\theta_n$) relative to the arrangement direction a, that is a direction in which the solar cells 100 are arranged.

Here, the n finger electrode 250 and the p finger electrode 260 are alternately arranged on a projection plane parallel to the main surface of the n-type Si substrate 220 and have a line shape. In addition, the p finger is electrode 260 is connected to the p-type a-Si layer 240 through the conductive member 276.

The p bus bar 271 is connected to the p finger electrode 260 as in the above-described first embodiment, and is insulated from the n finger electrode 250. Similarly, the n bus bar 273 is connected to the n finger electrode 250, and is insulated from the p finger electrode 260.

In addition, the p bus bar 271 and the n bus bar 273 intersect with the n finger electrode 250 and the p finger electrode 260 respectively on the projection plane parallel to the main surface of the n-type Si substrate 220.

Moreover, the p bus bar 271 of the solar cell 100a and the n bus bar 273 of the solar cell 100b are located on an approximately straight line.
(Operation and Effect)

According to the solar cell 100 and the solar cell module 200 in the third embodiment of the present invention, the p bus bar 271 and the n bus bar 273 intersect with the n finger electrode 250 and the p finger electrode 260 respectively on the projection plane parallel to the main surface of the n-type Si substrate 220. Hence, the degrees of freedom in the shapes and the arrangements of the p bus bar 271 and the n bus bar 273 can be increased.

More specifically, in the third embodiment of the present invention, the member that shuts out the solar light is set to be the conductive member 276 only. This makes it possible to improve the conversion efficiency.

Additionally, according to the solar cell 100 and the solar cell module 200 in the third embodiment of the present invention, the p bus bar 271 and the n bus bar 273 are not parallel to the arrangement direction a, but have the predetermined slope angle ($\theta_p$, $\theta_n$) relative to the arrangement directions a.

Accordingly, the solar cells 100 that are adjacent to each other can be connected in series without inverting the polarity of the solar cell 100 or without inverting the direction of the solar cell 100 as compared with the case where the p bus bar 271 and the n bus bar 273 are located parallel to the arrangement direction a. In other words, the productivity of the solar cell module 200 is improved since no attention needs to be paid to the arrangement relationship of the solar cells 100.

In addition, according to the solar cell 100 and the solar cell module 200 related to the third embodiment of the present invention, the p bus bar 271 of the solar cell 100a and the n bus bar 273 of the solar cell 100b adjacent to the solar cell 100a are located on the approximately straight line.

Thus, since the copper tub wire 272 located on the p bus bar 271 of the solar cell 100a and the n bus bar 273 of the solar cell 100b has no need to be bent and deformed, the arrangement of the copper tub wire 272 becomes easy, thereby suppressing a decrease in the durability of the copper tub wire 272.

Fourth Embodiment

Hereinafter, a fourth embodiment of the present invention will be described with reference to the drawings. Note that, the difference between the first embodiment described above and the fourth embodiment will be described below.

More specifically, although the p-type a-Si layer is provided on the back surface side of the n-type Si substrate in the first embodiment described above, a p-type a-Si region is provided so as to surround the n-type Si substrate, in the fourth embodiment.

(Configuration of Solar Cell)

Figure 10:
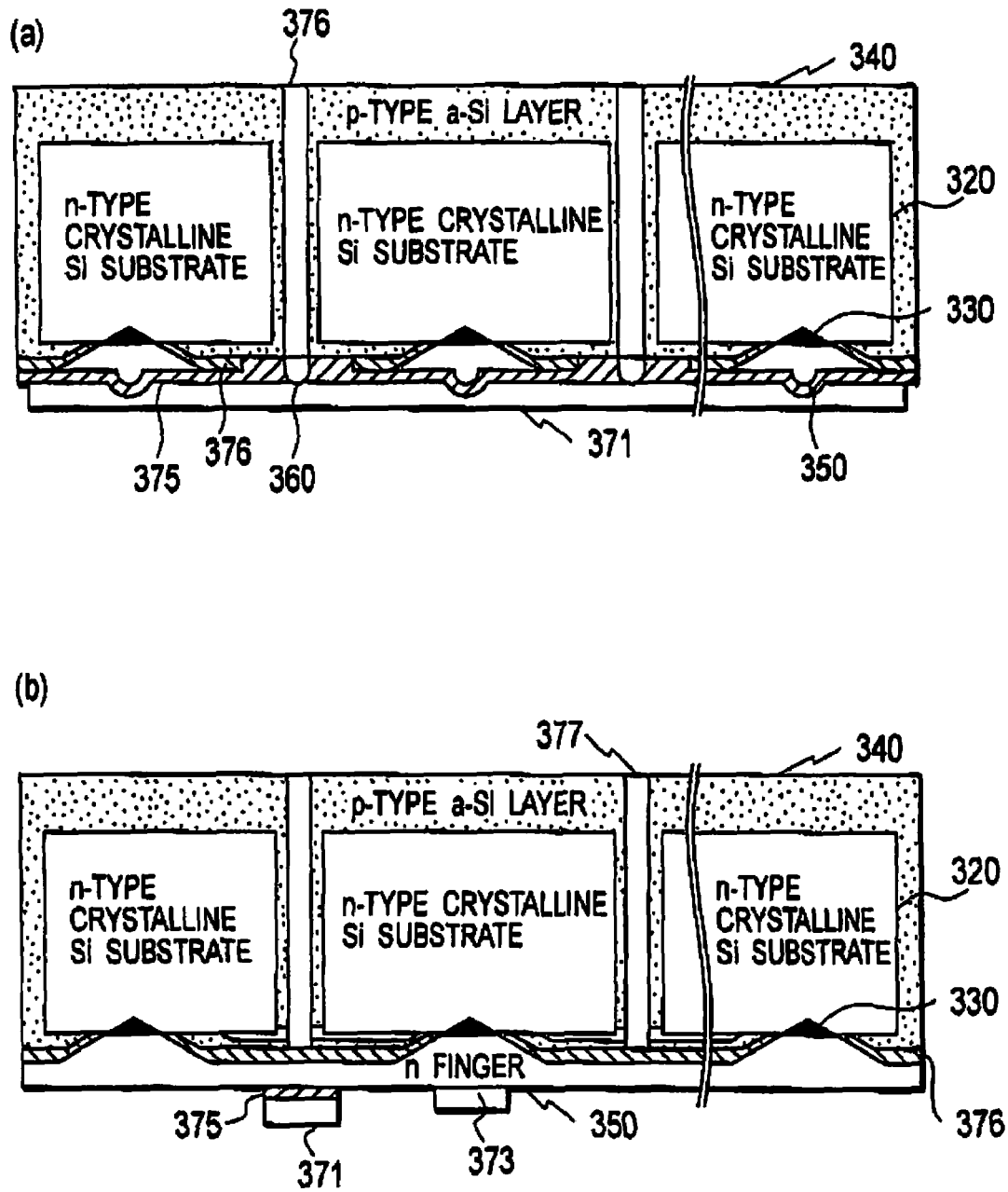
FIG. 10 is a diagram showing a cross section of a solar cell 100 according to a fourth embodiment of the present invention.

Hereinafter, the configuration of a solar cell according to the fourth embodiment of the present invention will be described with reference to the drawings. FIG. 10 is a diagram showing a cross section of the solar cell 100 according to the fourth embodiment of the present invention. Note that, FIG. 10(a) is a sectional view in which the solar cell 100 is viewed from a direction G shown in FIG. 11 to be described later, while FIG. 10(b) is a sectional view in which the solar cell 100 is viewed from a direction H shown in FIG. 11 to be is described later.

As shown in FIG. 10(a), the solar cell 100 has an n-type Si substrate 320, a high concentration n-type doped region 330, a p-type a-Si region 340, an n finger electrode 350, a p finger electrode 360, a p bus bar 371, an insulating layer 375, a through hole 376 and an insulating layer 377.

The n-type Si substrate 320, the p-type a-Si region 340, the n finger electrode 350, the p finger electrode 360, the p bus bar 371, and the insulating layer 375 have configurations similar to the n-type crystalline Si substrate 20, the p-type a-Si layer 40, the n finger electrode 50, the p finger electrode 60, the p bus bar 71, and the insulating layer 75 described above. In addition, the through hole 376 has a configuration similar to the above-described through hole 176. However, the p-type a-Si region 340 is configured to surround the n-type Si substrate 320, and the high concentration n-type doped region 330 is provided on the back surface side of the n-type Si substrate 320.

The high concentration n-type doped region 330 is formed by a diffusion of impurities, an ion implantation, or the like. Incidentally, the high concentration n-type doped region 330 may also be formed by a laser doping method. Additionally, the insulating layer 377 is composed of polyimide or the like, and insulates the high concentration n-type doped region 330 from the p-type a-Si region 340.

As shown in FIG. 10(b), the solar cell 100 has an n bus bar 373 in addition to the configuration shown in FIG. 10(a). Incidentally, the n bus bar 373 has a configuration similar to the n bus bar 73.

(Configuration of Solar Cell Module)

Figure 11:
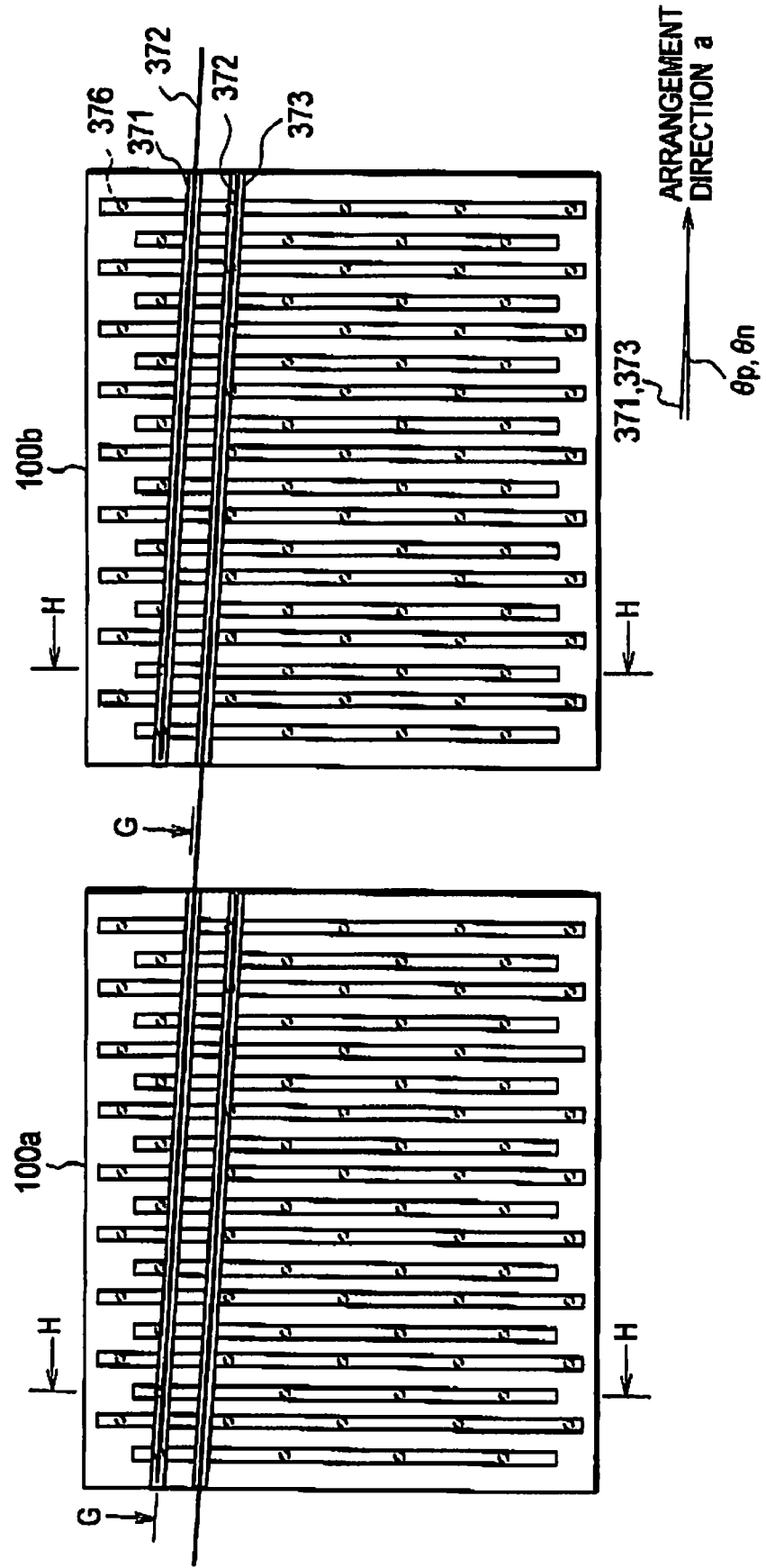
FIG. 11 is a diagram showing a solar cell module 200 according to the fourth embodiment of the present invention.

Next, the configuration of a solar cell module according to the fourth embodiment of the present invention will be described with reference to the drawings. FIG. 11 is a diagram showing the configuration of a solar cell module 200 according to the fourth embodiment of the present invention. Note that, FIG. 11 is a diagram in which the solar cell module 200 is viewed from the back is surface side of each of the solar cells 100.

As shown in FIG. 11, the solar cell module 200 has the plurality of solar cells 100 and a copper tub wire 372. Note that, the copper tub wire 372 connects in series the solar cells 100 (a solar cell 100a and a solar cell 100b) that are adjacent to each other as similar to the above-described copper tub wire 72.

The p bus bar 371 has a predetermined slope angle ($\theta_p$) relative to an arrangement direction a, that is a direction in which the solar cells 100 are arranged. Similarly, the n bus bar 373 has a predetermined slope angle ($\theta_n$) relative to the arrangement direction a, that is a direction in which the solar cells 100 are arranged.

Here, the n finger electrode 350 and the p finger electrode 360 are alternately arranged on a protection plane parallel to the main surface of the n-type Si substrate 320 and have a line shape.

The p bus bar 371 is connected to the p finger electrode 360 as in the above-described first embodiment, and is insulated from the n finger electrode 350. Similarly, the n bus bar 373 is connected to the n finger electrode 350, and is insulated from the p finger electrode 360.

In addition, the p bus bar 371 and the n bus bar 373 intersect with the n finger electrode 350 and the p finger electrode 360 respectively on the projection plane parallel to a main surface of the n-type Si substrate 320.

Moreover, the p bus bar 371 of the solar cell 100a and the n bus bar 373 of the solar cell 100b are located on an approximately straight line.

(Operation and Effect)

According to the solar cell 100 and the solar cell module 200 in the fourth embodiment of the present invention, the p bus bar 371 and the n bus bar 373 intersect with the n finger electrode 350 and the p finger electrode 360 respectively on the projection plane parallel to a main surface of the n-type Si substrate 320. Hence, the degrees of freedom in the shapes and the arrangements of the p bus bar 371 and the n bus bar 373 can be increased.

More specifically, in the fourth embodiment of the present invention, it is possible to reduce the distance and the time in which the electrons and holes, which are generated in the n-type Si substrate 320, move before the electrons and holes are taken out by the n finger electrode 350 and the p finger electrode 360. As a result, the loss caused by a bulk recombination can be prevented and the conversion efficiency can be improved.

Additionally, according to the solar cell 100 and the solar cell module 200 according to the fourth embodiment of the present invention, the p bus bar 371 and the n bus bar 373 are not parallel to the arrangement direction a, but have the predetermined slope angle ($\theta_p$, $\theta_n$) relative to the arrangement direction a.

Accordingly, the solar cells 100 that are adjacent to each other can be connected in series without inverting the polarity of the solar cell 100 or without Inverting the direction of the solar cell 100 as compared with the case where the p bus bar 371 and the n bus bar 373 are located parallel to the arrangement direction a. In other words, the productivity of the solar cell module 200 is improved since attention has no need to be paid to the arrangement relationship of the solar cells 100.

In addition, according to the solar cell 100 and the solar cell module 200 according to the fourth embodiment of the present invention, the p bus bar 371 of the solar cell 100a and the n bus bar 373 of the solar cell 100b adjacent to the solar cell 100a are located on the approximately straight line.

Thus, since the copper tub wire 372 located on the p bus bar 371 of the solar cell 100a and the n bus bar 373 of the solar cell 100b has no need to be bent and deformed, the arrangement of the copper tub wire 372 becomes easy, thereby suppressing a decrease in the durability of the copper tub wire 372.

Fifth Embodiment

Hereinafter, a fifth embodiment of the present invention will be described with reference to the drawings. Note that, the difference between the second embodiment described above and the fifth embodiment will be described below.

More specifically, although the p bus bar 171 is insulated from the n finger electrode 150 by the insulating member 175 in the above-described second embodiment, the n finger electrode 150 is not provided in the region in which the p bus bar 171 is located to thereby insulate the p bus bar 171 from the n finger electrode 150, in the fifth embodiment Note that the n finger electrode 150 is divided into the divided n finger electrodes 150, and is located by sandwiching the p bus bar 171 between the divided n finger electrodes 150.

(Configuration of Solar Cell)

Figure 12:
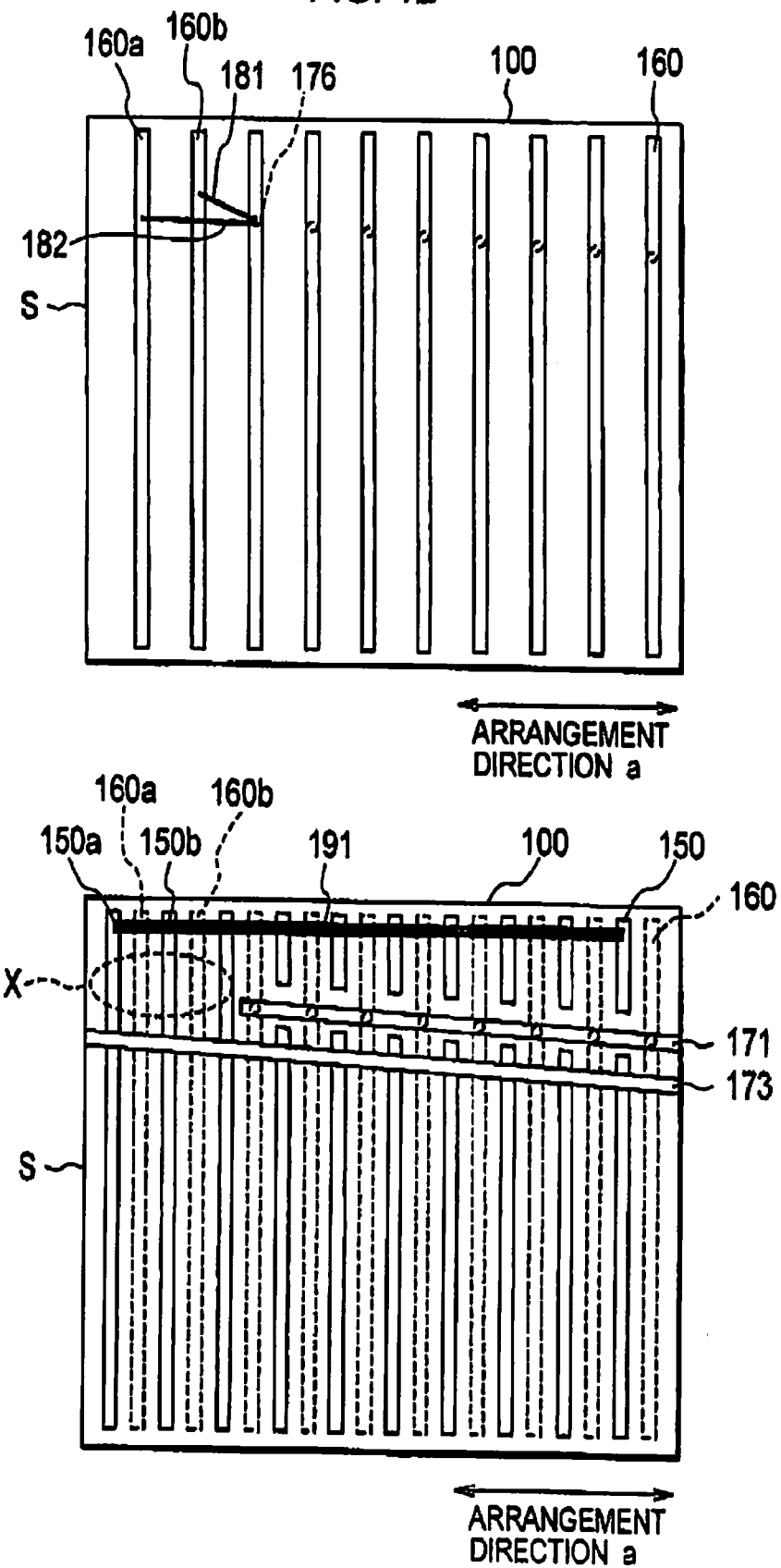
FIG. 12 is a diagram showing the solar cell 100 according to the fourth embodiment of the present invention.
Figure 13:
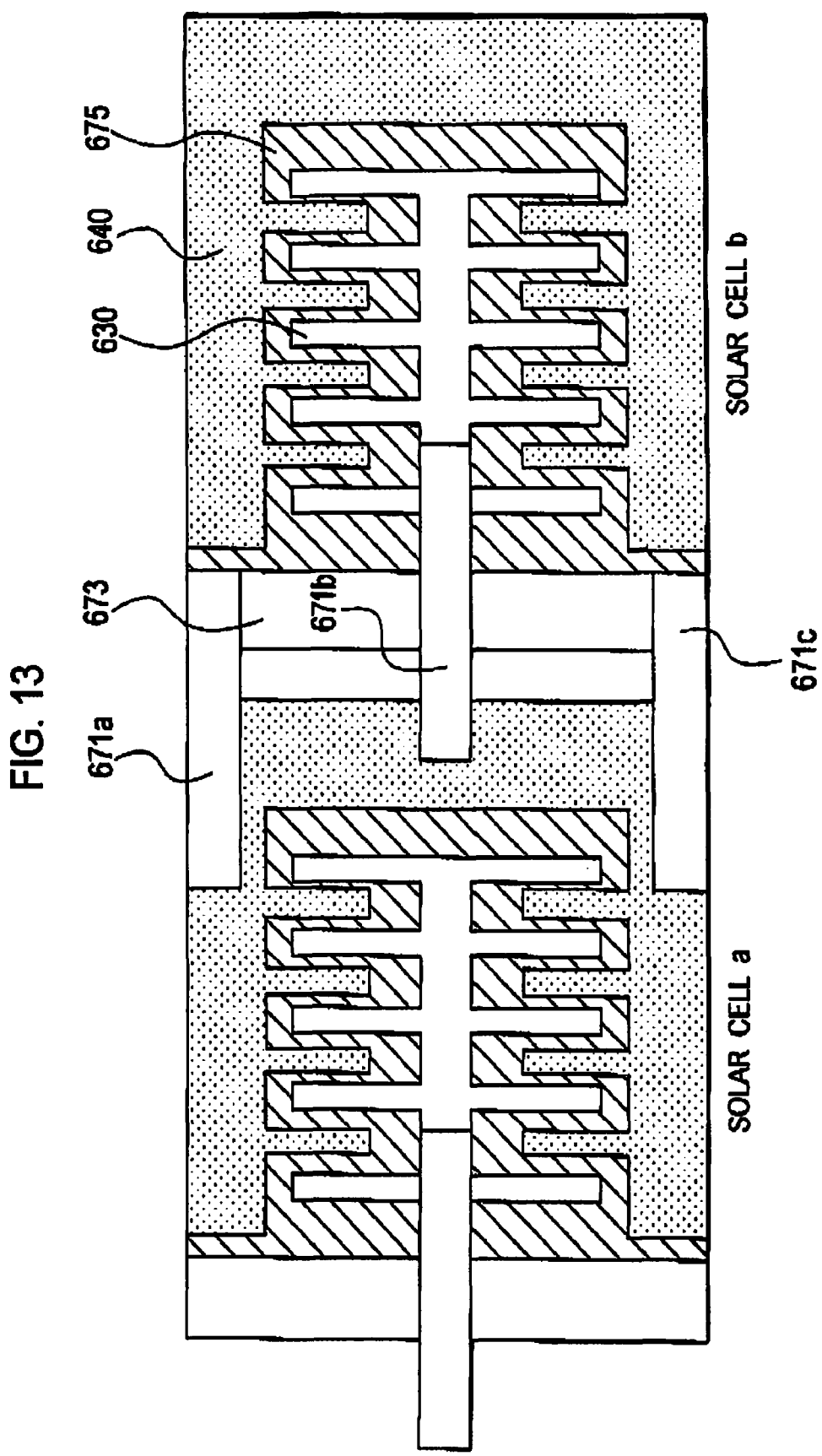
FIG. 13 is a diagram showing the back surface of a solar cell module according to a conventional art.

Hereinafter, the configuration of a solar cell related to the fifth embodiment of the present invention will be described with reference to the drawings. FIG. 12 is a diagram showing a solar cell 100a according to the fifth embodiment of the present invention. Incidentally, FIG. 12(a) is a diagram in which the solar cell 100a is viewed from the front surface side, while FIG. 12(b) is a diagram in which the solar cell 100a is viewed from the back surface side.

As shown in FIG. 12(a), as in the second embodiment, a p finger electrode 16D is provided on a main surface on the front surface side of the solar cell 100a(substrate). A through hole 176 is provided and penetrates the solar cell 100a from a main surface on the front surface side of the solar cell 100a toward a main surface on the back surface side of the solar cell 100a.

Here, a part of the p finger electrode 160 (a p finger electrode 160a and a p finger electrode 160b) of the plurality of p finger electrodes 180 is not provided with a through hole 176 corresponding thereto. The p finger electrode 160a and the p finger electrode 160b are electrically connected, through conductive members (a conductive member 181 and a conductive member 182), to the through hole 176 which corresponds to other p finger electrode of the plurality of p finger electrodes 160. Incidentally, the conductive members 181 and 182 are formed by a printing method or the like.

As shown in FIG. 12(b), as in the second embodiment, the n finger electrode 150 is provided on the main surface on the back surface side of the solar cell 100a (substrate). The p bus bar 171 and an n bus bar 173 are provided on the main surface on the back surface side of the solar cell 100a.

Here, the n finger electrode 150 is divided into the divided n finger electrodes 150 and is not located in a region where the p bus bar 171 is located, by sandwiching the p bus bar 171 between the divided n finger electrodes 150. In other words, the n finger electrode 150 is discontinued in the region where the p bus bar 171 is located. Therefore, the n finger electrode 150 is insulated from the p bus bar 171.

The p bus bar 171 is located by providing a predetermined space X from a side S of the solar cell 100a in the arrangement direction a. Here, it should be noted that the above-described p finger electrode 160a and p finger electrode 160b are part of the plurality of p finger electrodes 160 passing through the predetermined space X on the projection plane parallel to the main surface of the solar cell 100a.

A conductive member 191 is located in the predetermined arrangement direction a and electrically connects divided n finger electrodes 150 located on the opposite side of the n bus bar 173, to the n bus bar 173. The conductive member 191 is electrically connected to the n finger electrodes (n finger electrodes 150a and 150b) which passes through the predetermined space X. Incidentally, the conductive member 191 is formed by a printing method or the like.

More specifically, the divided n finger electrodes 150 located on the opposite side of the n bus bar 173 is electrically connected to the n bus bar 173, by the conductive member 191, the n finger electrode 150a and the n finger electrode 150b.

Note that, a conductive member that electrically connects the conductive member 191 to the n bus bar 173 may be located in the predetermined space X in place of the n finger electrodes 150a and 160b. Incidentally, such a conductive member is formed by a printing method or the like.

(Operation and Effect)

According to the solar cell 100 in the fifth embodiment of the present invention, the n finger electrode 150 is discontinued in the region where the p bus bar 171 is located, thereby insulating the n finger electrode 150 from the p bus bar 171 without using the insulating member 175.

In such case, the conductive member 191, the n finger electrode 150a and the n finger electrode 150b electrically connect the divided n finger electrodes 150 located on the opposite side of the n bus bar 173 while sandwiching the p has bar 171 therebetween, to the n bus bar 173. Thereby, the electrons taken out by the divided n finger electrodes 150 located on the opposite side of the n bus bar 173, are prevented from being wasted.

In addition, the conductive member 181 and the conductive member 182 electrically connect the p finger electrodes 160a and 100b, which pass through the predetermined space X on the projection plane parallel to the main surface of the solar cell 100a, to the through hole 176 which corresponds to the other p finger electrode of the plurality of p finger electrodes 160. Thereby, the holes taken out by the p finger electrodes 160a and 160b are prevented from being wasted.

Other Modification Examples

The present invention has been described by the aforementioned embodiments. However, the descriptions and drawings constituting a part of this disclosure should not be understood to limit this invention. This disclosure will reveal various alternative embodiments, examples, and applications to those skilled in the art.

More specifically, although each of the insulating layers (the insulating layer 75, the insulating member 175, the insulating layer 275, the insulating member 277, the insulating layer 375 and the insulating layer 377) are composed of polyimide in the first to fourth embodiments described above, it is not limited thereto.

For example, unless the temperature of an Si substrate needs to be kept at 250 degrees Celsius or less when forming the solar cell 100, each insulating layer may be composed of epoxy resin, or $SiO_2$ or $Al_2O_3$ that is vacuum-deposited, or the like. In addition, an amorphous Si layer may be provided between an Si substrate and an insulating layer.

Additionally, in the above-described first to fourth embodiments, though an n-type Si substrate is used as a substrate for description, the substrate is not limited to this and a p-type Si substrate may also be used as a substrate.

Moreover, in the above-described first to fourth embodiments, the angle ($\theta_p$) which is formed by the p bus bar and the direction (the arrangement direction a) where the solar cells 100 are arranged is the same as the angle ($\theta_n$) which is formed by the arrangement direction a and the n bus bar. However, the angle is not limited to this and the angle ($\theta_p$) may differ from the angle ($\theta_n$).

Furthermore, in the above-described first to fourth embodiments, the n finger electrodes and the p finger electrodes are alternately arranged one by one. However, the arrangement is not limited thereto. In other words, "the n finger electrode and the p finger electrode are alternately arranged" is the concept Including the case where n consecutive n finger electrodes and m consecutive p finger electrodes are alternately arranged.

INDUSTRIAL APPLICABILITY

According to the present invention, it is possible to provide a solar cell, in which degrees of freedom in the shapes and the arrangements of each electrode, each bus bar and the like can be increased and no attention needs to be paid to the arrangement relationship of solar cells, and a solar cell module using the solar cell.

The invention claimed is:

1. A first solar cell and a second solar cell electrically connected in an arrangement direction, each cell comprising an n finger electrode and a p finger electrode alternately arranged on a projection plane parallel to a main surface of a substrate, wherein each solar cell comprises
an n-side bus bar electrode connected to the n finger electrode and insulated from the p finger electrode and
a p-side bus bar electrode connected to the p finger electrode and insulated from the n finger electrode,
wherein the n-side bus bar electrode and the p-side bus bar electrode are parallel to each other and provided on a same main surface side of the substrate, intersect with the n finger electrode and the p finger electrode respectively on the projection plane, and the bus bar electrodes have a non-zero slope angle relative to the arrangement direction and configured to allow adjacent solar cells to be connected in series without inverting the polarity of the solar cell or without inverting the direction of the solar cell, and wherein a bus bar electrode from the first solar cell is in the same direction as and connects to a bus bar electrode from the second solar cell.

2. The solar cell according to claim 1, wherein
the p finger electrode is provided on a front side main surface of the substrate,
the n finger electrode is provided on a back side main surface of the substrate,
the n-side bus bar electrode and the p-side bus bar electrode are provided on the back-side main surface of the substrate,
a through hole which penetrates the substrate from the front-side main surface to the back side main surface is provided, and
the through hole establishes a connection between the p finger electrode provided on the front-side main surface, and the p-side bus bar electrode provided on the back side main surface.

3. The solar cell according to claim 2, wherein
the n finger electrode is divided into the divided n finger electrodes, and is not located in a region where the p-side bus bar electrode is located, by sandwiching the p-side bus bar electrode between the divided n finger electrodes, and
a divided n finger electrode located on the opposite side of the n-side bus bar electrode is connected to the n-side bus bar electrode.

4. The solar cell according to claim 3, wherein:
a first conductive member is located in the predetermined arrangement direction and connects each of the divided n finger electrode located on the opposite side of the n-side bus bar electrode;
the p-side bus bar electrode is located by providing a predetermined space from a side of the substrate in the predetermined arrangement direction; and
a second conductive member is located in the predetermined space and establishes a connection between the first conductive member and the n-side bus bar electrode.

5. The solar cell according to claim 4, wherein
a p finger electrode passing through the predetermined space on the protection plane is connected to a through hole which corresponds to a p finger electrode not passing through the predetermined area on the projection plane.

6. The first and second solar cells of claim 1, wherein the finger electrodes are arranged perpendicular to the arrangement direction and each bus bar is arranged in a direction between the finger electrode and the arrangement direction.

7. A solar cell module in which a plurality of solar cells are arranged in a predetermined arrangement direction for electrical connection, wherein each solar cell comprises an alternatively arranged n finger electrode and a linear p finger electrode on a projection plane parallel to a main surface of the substrate, wherein each solar cells includes:
an n-side bus bar electrode connected to the n finger electrode and Insulated from the p finger electrode and
a p-side bus bar electrode connected to the p finger electrode and insulated from the n finger electrode and
the n-side bus bar electrode and the p-side bus bar electrode are provided on a same main surface side of the substrata, and intersect with the n finger electrode and the p finger electrode respectively on the projection plane, and the bus bar electrodes have a non-zero slope angle relative to the predetermined arrangement direction and configured to allow adjacent solar cells to be connected in series without inverting the polarity of the solar cell or without inverting the direction of the solar cell.

8. The solar cell module according to claim 7, further comprising
a tab wire which connects the n-side bus bar electrode to the p-side bus bar electrode and which Is located on the n side bus bar electrode of one solar cell and on the p-side bus bar electrode of a different solar cell adjacent to the one solar cell, in which the one solar cell and the different solar cell are respectively included In the plurality of solar cells, wherein the n-side bus bar electrode of the one solar cell and the p-side bus bar electrode of the different solar cell are located on en approximately straight line.

* * * * *